United States Patent [19]

West

[11] Patent Number: 4,584,490
[45] Date of Patent: Apr. 22, 1986

[54] INPUT CIRCUIT FOR PROVIDING DISCHARGE PATH TO ENHANCE OPERATION OF SWITCHING TRANSISTOR CIRCUITS

[75] Inventor: Jeffrey A. West, Pleasant Grove, Utah

[73] Assignee: Signetics Corporation, Sunnyvale, Calif.

[21] Appl. No.: 595,061

[22] Filed: Mar. 30, 1984

[51] Int. Cl.[4] .................. H03K 17/04; H03K 17/60; H03K 19/013; H03K 19/088

[52] U.S. Cl. .................................. 307/456; 307/443; 307/458; 307/547; 307/563; 307/264

[58] Field of Search ............ 307/443, 456, 454, 457, 307/458, 544, 546, 547, 549, 551, 552, 553, 557–559, 563, 299 A, 264, 254, 273, 200, 280, 300

[56] References Cited

U.S. PATENT DOCUMENTS

| | | | |
|---|---|---|---|
| 3,233,125 | 2/1966 | Buie | 307/456 |
| 3,491,251 | 1/1970 | Witsell | 307/457 X |
| 3,588,851 | 6/1971 | Jordan, Jr. | 307/254 X |
| 3,889,137 | 6/1975 | Kay | 307/254 X |
| 3,921,007 | 11/1975 | Lacher | 307/456 |
| 4,049,975 | 9/1977 | Colaco | 307/456 |
| 4,321,490 | 3/1982 | Bechdolt | 307/456 |
| 4,501,976 | 2/1985 | West et al. | 307/456 |

Primary Examiner—Stanley D. Miller
Assistant Examiner—David Roy Bertelson
Attorney, Agent, or Firm—R. J. Meetin; R. T. Mayer; T. A. Briody

[57] ABSTRACT

A bipolar input circuit for regulating the current/voltage level at the base of a switching transistor (QA) provides a capacitively-controlled discharge path from the base through a discharge transistor (QC) when an input signal ($V_I$) makes certain voltage transitions. The base of the switching transistor responds to the voltage at an emitter (E1) of an input transistor (QB) which has another emitter (E2) coupled to the base of the discharge transistor. Its base is further coupled to a capacitor (C) which controls the discharge path.

12 Claims, 4 Drawing Figures

INPUT CIRCUIT FOR PROVIDING DISCHARGE PATH TO ENHANCE OPERATION OF SWITCHING TRANSISTOR CIRCUITS

FIELD OF USE

This invention relates to bipolar circuits for controlling the operation of electronic components. More particularly, this invention relates to such circuits that enhance switching in digital gates using logic such as transistor-transistor logic (TTL).

BACKGROUND ART

TTL circuits are derived from a common logic structure of which FIG. 1 shows a conventional arrangement. In this NAND gate connected between terminals for receiving low and high supply voltages $V_{EE}$ and $V_{CC}$, input signals represented here by voltages $V_{I1}$ and $V_{I2}$ are provided to the corresponding emitters of a multiple-emitter NPN input transistor Q1. Its base is coupled through a resistor R1 to the $V_{CC}$ supply. Elements Q1 and R1 form an input circuit for the gate.

The collector of transistor Q1 is connected to the base of an NPN phase-splitting transistor Q2 in an output circuit of the gate. The Q2 collector is coupled through a resistor R2 to the $V_{CC}$ supply. The Q2 collector is further connected to the base of an NPN transistor Q3. Its emitter drives an NPN output transistor Q4 and is coupled through a resistor R3 to the Q4 emitter. The interconnected collectors of the Darlington pair Q3 and Q4 are coupled through a resistor R4 to the $V_{CC}$ supply.

The Q2 emitter drives the base of an NPN output transistor Q5 whose emitter is tied to the $V_{EE}$ supply. A pull-down resistor R5 is connected between the Q5 base and the $V_{EE}$ supply. An output voltage signal $V_O$ is provided from interconnection of the Q5 collector and the Q4 emitter.

To understand the operation of this gate, assume that at least one of inputs $V_{I1}$ and $V_{I2}$—e.g., input $V_{I1}$—is initially at a low voltage or logical "0" (hereafter just "0") below the input switching point. Transistors Q2 and Q5 are off because current through resistor R1 to the $V_{I1}$ input terminal pulls the Q2 base voltage to a low value. Transistors Q3 and Q4 are on. Output $V_O$ is at a high voltage or logical "1" (hereafter just "1").

Let voltage $V_{I1}$ be raised to a "1" above the input switching point. The R1 current decreases and starts flowing through the Q1 base-collector junction to transistor Q2. It turns on and draws current through resistor R2 to turn off transistors Q3 and Q4. Part of the R2 current goes to transistor Q5 which turns on and actively pulls voltage $V_O$ down to a "0". The reverse occurs when input $V_{I1}$ is returned to "0". The R1 current increases and begins flowing to the $V_{I1}$ terminal. Transistors Q2 and Q5 turn off while transistors Q3 and Q4 turn on to actively pull voltage $V_O$ up to "1".

As phase splitter Q2 turns off, charge carriers in its base discharge through input transistor Q1 to the $V_{I1}$ terminal. This enables the gate to have a relatively high switching speed. However, the maximum input current (when input $V_{I1}$ is low) is typically on the order of milliamperes. This level is too high for many applications.

DISCLOSURE OF THE INVENTION

In accordance with the invention, an input circuit responsive to an input signal for regulating the current/voltage level at a control electrode of an electronic component provides a capacitively-controlled discharge path from the control electrode when the input signal makes certain voltage transitions. The circuit is particularly suited for TTL gates. The discharge path enables the switching speed to be high. The maximum input current to the circuit is quite low, typically on the order of microamperes. This is several orders of magnitude below that of conventional input circuits of the type described above.

The present circuit contains a bipolar input transistor element having one or more bases responsive to the input signal, a first emitter to whose voltage the control electrode is responsive, and a second emitter. A like-polarity bipolar discharge transistor has a base coupled to the second emitter, an emitter responsive to the input signal, and a collector coupled to the control electrode. A capacitive element is coupled between the base of the discharge transistor and a terminal for receiving a first supply voltage.

The discharge transistor temporarily turns on when the input signal passes a prescribed transition voltage while changing more than a specified amount in going from a voltage at which the input transistor element is turned on through the first emitter to another voltage at which the input transistor element is turned off through the first emitter. This opens a current path from the control electrode through the discharge transistor. If the control electrode is the base of a like-polarity bipolar switching transistor which turns on when the input transistor element turns on through its first emitter and vice versa, charge carriers in the base of the switching transistor discharge through the current path to provide a low turn-off time for the switching transistor.

The present circuit preferably includes circuitry that substantially isolates current through the first emitter from current at the control electrode of the electronic component. This reduces the total current drawn by the circuit to a low level while maintaining a high switching speed. While still allowing the input transistor element to control the voltage at the control electrode, the isolation circuitry normally prevents the control electrode from placing a voltage clamp on the input signal. The isolation circuitry also controls the input switching point.

In the isolation circuitry, a rectifier is coupled between the first emitter by way of a first node and the control electrode by way of a second node. The rectifier is oriented back-to-back with the base-emitter junction for the first emitter. A current source is coupled between the first node and the first voltage supply. An impedance element such as a resistor is coupled between the second node and a second voltage supply.

Figure 1:
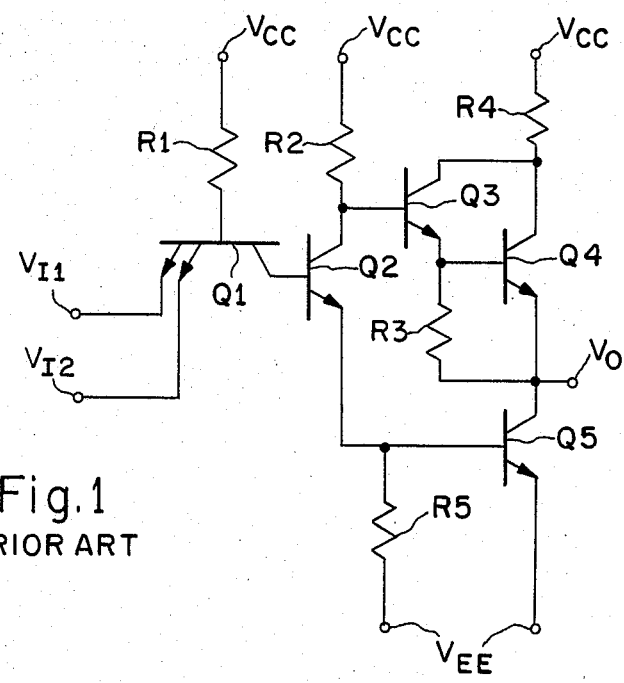
FIG. 1 is a circuit diagram of a conventional TTL gate.

Each Schottky diode whose anode is connected to the base of an NPN transistor and whose cathode is connected to the collector of the transistor so as to clamp it out of deep saturation is not shown in the drawings. Instead, the base of each such Schottky-clamped NPN transistor is illustrated as a long block "S" to represent the clamping Schottky diode.

Like reference symbols are employed in the drawings and in the description of the preferred embodiments to represent the same or very similar item or items.

DESCRIPTION OF THE PREFERRED EMBODIMENTS

Figure 2:
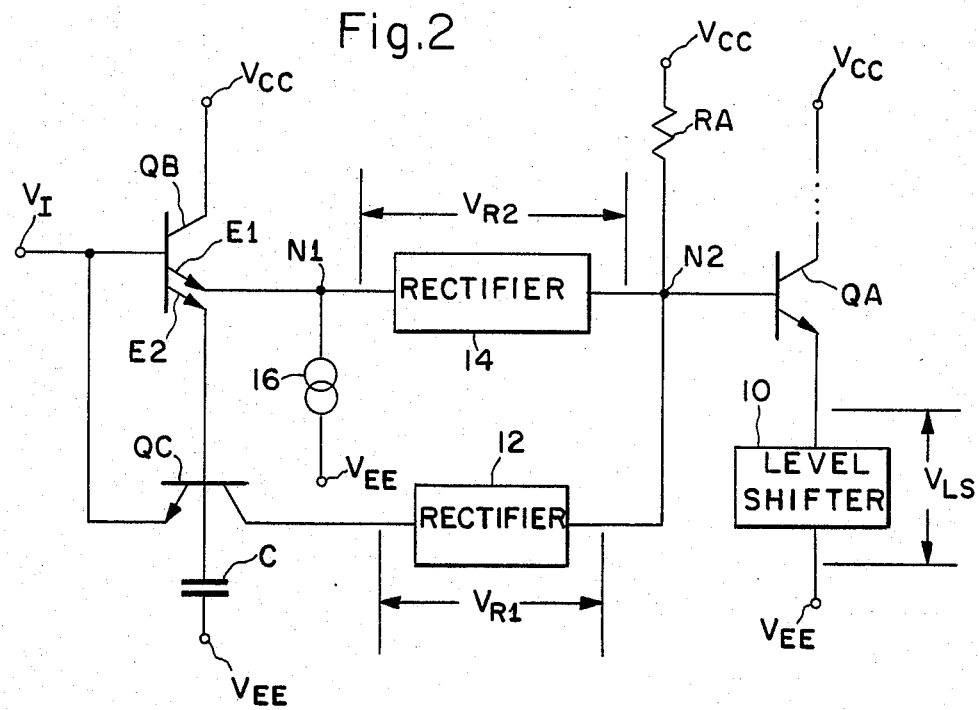
FIG. 2 is a circuit diagram of an input circuit for regulating the switching of a bipolar transistor in accordance with the invention.

Turning to FIG. 2, it illustrates an input circuit for regulating the current/voltage level at a control electrode of an electronic component consisting (at least) of an NPN switching transistor QA whose base is the control electrode. The QA emitter is coupled through a voltage level shifter 10 to the $V_{EE}$ terminal. A voltage $V_{LS}$ occurs across level shifter 10 when it is conductive and transmits current from the QA emitter to the $V_{EE}$ supply. The QA collector is coupled (through unspecified circuitry) to the $V_{CC}$ terminal.

The input circuit contains a multiple-emitter NPN input transistor QB whose base is connected to an input terminal to receive an input voltage signal $V_I$. The QB collector is tied to the $V_{CC}$ supply. A first emitter E1 of transistor QB is coupled to the base of transistor QA. Its base is further coupled through a blocking rectifier 12 to the collector of an NPN discharge transistor QC whose base is coupled to an emitter E2 of transistor QB. The QC emitter is connected to the input terminal to receive input $V_I$. An element C functioning as a capacitor is connected between the $V_{EE}$ supply and the QC base.

Rectifier 12 is oriented in the forward conductive direction of the QC base-emitter junction. This allows rectifier 12 to prevent charge intended for capacitor C from going to the QA base. A voltage $V_{R1}$ occurs across rectifier 12 when it is turned on.

The input circuit also includes circuitry that substantially isolates the current through emitter E1 from the QA base current. This isolation circuitry allows the E1 voltage to control the QA switching but prevents transistor QA from clamping the maximum level of voltage $V_I$.

The isolation circuitry consists of a rectifier 14, a substantially constant current source 16, and a resistor RA. Rectifier 14 is connected between emitter E1 by way of a node N1 and the QA base by way of a node N2. Rectifier 14 is oriented in a back-to-back configuration with the E1 base-emitter junction. A voltage $V_{R2}$ occurs across rectifier 14 when it is conductive. Current source 16 is connected between node N1 and the $V_{EE}$ supply. Resistor RA is connected between node N2 and the $V_{CC}$ supply.

When the E1 or E2 base-emitter junction is conductive, its voltage drop is about 1 $V_{BE}$, where $V_{BE}$ is the absolute value of the standard base-to-emitter voltage of a bipolar transistor when it is just conductive. $V_{BE}$ is about 0.75 volt. Likewise, about 1 $V_{BE}$ occurs across the base-emitter junction of each of transistors QA and QC when it is conductive. When transistor QC is turned on, its collector-to-emitter voltage must be at least a $V_{SAT}$ which is typically less than 0.1 volt. The elements that form rectifiers 12 and 14 are chosen such that $V_{R2}$ is less than $V_{R1}+V_{BE}+V_{SAT}$. With these items in mind and assuming, for convenience, that supply $V_{EE}$ is 0 volts, the circuit of FIG. 2 operates as follows.

When input $V_I$ is at a "1" or high voltage $V_{IH}$ above the input switching point of 2 $V_{BE}+V_{LS}-V_{R2}$, transistor QA and level shifter 10 are both conductive. The QA base receives drive current from the $V_{CC}$ supply by way of resistor RA. Transistor QB is turned on through emitter E1. Since the QA base voltage is $V_{BE}+V_{LS}$ while the voltage at emitter E1 is $V_{IH}-V_{BE}$, rectifier 14 is off. Current source 16 provides the current for emitter E1. Transistor QC and rectifier 12 are both off. The E2 base-emitter junction is either at the edge of conduction or is non-conductive. Accordingly, the QC base voltage equals or exceeds $V_{IH}-V_{BE}$.

Input $V_I$ is now reduced to a "0" or low voltage $V_{IL}$ below the input switching point. This causes the E1 voltage to drop. As voltage $V_I$ approaches the input switching point, transistor QB starts turning off. The reduced E1 voltage enables rectifier 14 to turn on. With rectifier 14 turned on, a slight further reduction in the E1 voltage brings the QA base voltage below $V_{BE}+V_{LS}$. This causes transistor QA and shifter 10 to start turning off. Meanwhile, capacitor C holds the QC base voltage near its high level of $V_{IH}-V_{BE}$ or more.

Input $V_I$ continues dropping to low level $V_{IL}$ which is more than 2 $V_{BE}$ below high level $V_{IH}$ and which is also less than $V_{BE}+V_{LS}-V_{SAT}-V_{R1}$. This last-mentioned voltage is termed the transition voltage $V_{TR}$. One of two situations now occurs.

If input $V_I$ drops slightly more than 2 $V_{BE}$ below $V_{IH}$ before reaching $V_{TR}$, the QC base-emitter junction becomes conductive. This allows element C to start discharging through the QC base-emitter junction to the input terminal. The QC base voltage follows voltage $V_I$ downward. However, transistor QC does not turn on because its collector voltage is too high to allow rectifier 12 to become conductive. When input $V_I$ reaches $V_{TR}$, transistor QC and rectifier 12 finally turn on to open a current path from the QA base to the $V_I$ terminal.

On the other hand, nothing happens if input $V_I$ reaches $V_{TR}$ before dropping more than 2 $V_{BE}$ below $V_{IH}$. The QC emitter voltage is too high. When voltge $V_I$ reaches slightly more than 2 $V_{BE}$ below $V_{IH}$, elements QC and 12 finally become conductive to open the current path from the QA base to the input terminal.

In either situation, charge carriers in the QA base discharge through the current path to the $V_I$ terminal. This speeds up the turn-off of transistor QA. By enhancing the QA turn-off, this also enhances the turn-off of level shifter 10. After a short while, transistors QB and QA are fully off as is shifter 10. Capacitor C also discharges through the QC base-emitter junction to the input terminal so that the QC base voltage follows input $V_I$ downward. Due to leakage from capacitor C to the $V_{EE}$ supply and to the input terminal, the QC base voltage drops below $V_{IL}+V_{BE}$. Transistor QC and rectifier 12 thereby turn off. Substantially all the RA current then flows through rectifier 14 and current source 16.

When input $V_I$ is returned to a voltage above the input switching point, elements QC and 12 remain off. Transistor QB turns on through emitter E1 as its voltage rises. This causes rectifier 14 to turn off and enables transistor QA and shifter 10 to turn on.

Transistor QB also turns on temporarily through emitter E2. Capacitor C charges through emitter E2 until the QC base voltage reaches 1 $V_{BE}$ below the high value of voltage $V_I$. When this occurs, the E2 base-emitter junction is at the edge of conduction. If input $V_I$ drops slightly, the E2 base-emitter junction becomes non-conductive. Rectifier 12 prevents the charging current for capacitor C from going to the QA base. The circuit is now ready for a high-to-low transition.

The elements that form rectifiers 12 and 14 could be chosen such that $V_{R2}$ exceeds $V_{R1}+V_{BE}+V_{SAT}$. The input circuit would still open the discharge path for charge carriers in the QA base. Because rectifier 12 then turns on before rectifier 14 when input $V_I$ goes low, some current waste would occur. That is, some of the RA current would temporarily flow through the discharge path to the $V_I$ terminal. The input circuit would not operate as efficiently as in the preferred case where $V_{R2}$ is less than $V_{R1}+V_{BE}+V_{SAT}$.

Insofar as the discharging of the QA base is concerned, the circuit of FIG. 2 operates essentially the same if rectifier 14, current source 16, and resistor RA are all absent. The transition points are different. The E1 current is no longer isolated from the QA base current. As a result, transistor QA clamps the maximum voltage of input $V_I$. However, the input circuit still provides the path from the QB base through transistor QC (and rectifier 12 if present) to the $V_I$ terminal for removing charge carriers from the base of transistor QB as it turns off, thereby increasing the average switching speed.

In particular, voltage $V_I$ is clamped at maximum value $V_{IH}$ which equals $2 V_{BE}+V_{LS}$ if elements 14, 16, and RA are deleted. At this voltage, transistor QA and shifter 10 are both on. Transistor QB is turned on through emitter E1 which provides the current drive to the QA base. Transistor QC and rectifier 12 are both off. The E2 base-emitter junction is either off or at the edge of conduction so that the QC base voltage is greater than or equal to $V_{IH}-V_{BE}$.

As input $V_I$ is reduced to low level $V_{IL}$ which again is more than $2 V_{BE}$ below $V_{IH}$ and which again is less than $V_{TR}$, transistors QB and QA start turning off along with shifter 10. One of the two situations described above occurs depending on whether input $V_I$ drops more than $2 V_{BE}$ before reaching $V_{TR}$ or vice versa. In either situation, transistor QC and rectifier 12 temporarily turn on to open the discharge path. Charge carriers in the QA base discharge to the $V_I$ terminal. Again, elements QC and 12 subsequently turn off as capacitor C discharges both by leakage and through the QC base-emitter junction until the QC base voltage is less than $V_{IL}+V_{BE}$.

In the transition back to $V_{IH}$, the E2 base-emitter junction becomes conductive before input $V_I$ reaches $2 V_{BE}$ above $V_{IL}$. Capacitor C charges through emitter E2. When input $V_I$ reaches $V_{IH}$, transistor QA and shifter 10 turn on. Transistor QB turns on through emitter E1, while the E2 base-emitter junction is at the edge of conduction. With capacitor C charged to $V_{IH}-V_{BE}$, the input circuit is ready for another transition.

Figure 3:
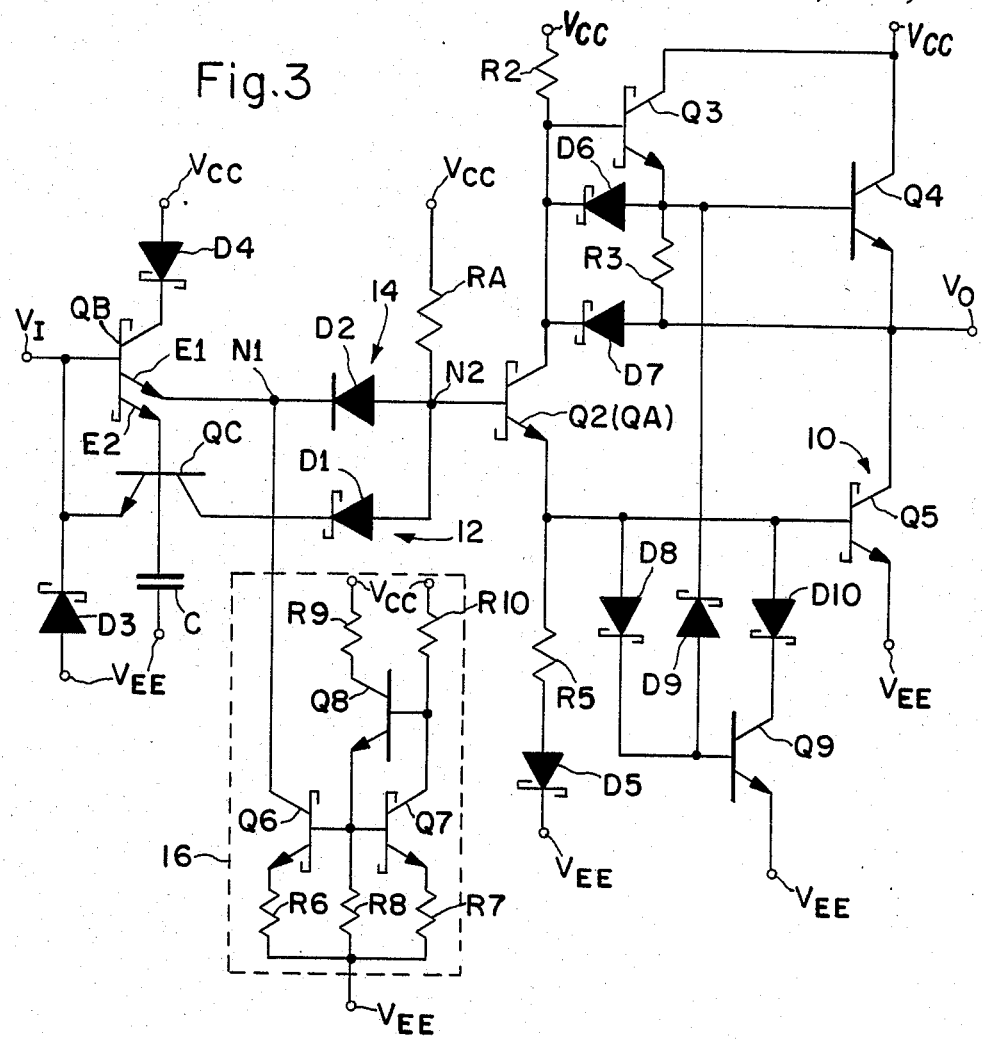
FIGS. 3 and 4 are circuit diagrams of preferred embodiments of TTL gates employing the input circuit of FIG. 2.

FIG. 3 shows a preferred embodiment of a TTL inverting gate employing the input circuit of FIG. 2. In FIG. 3, level shifter 10 is the base-emitter junction of NPN output pull-down transistor Q5. Voltage $V_{LS}$ is 1 $V_{BE}$. Transistor QA is NPN phase splitter Q2. Rectifier 12 is a Schottky diode D1. Voltage $V_{R1}$ is 1 $V_{SH}$ where $V_{SH}$ is the standard voltage drop across a Schottky diode when it is just conductive. $V_{SH}$ is about 0.5 volt. Rectifier 14 is a PN diode D2 so that voltage $V_{R2}$ is 1 $V_{BE}$.

Current source 16 is a current mirror centered on identical always-on NPN transistors Q6 and Q7 whose bases are connected together and through the emitter-base junction of an always-on NPN transistor Q8 to the Q7 collector. The Q6 collector is connected to node N1. The emitters of transistors Q6 and Q7 are coupled through respective resistors R6 and R7 to the $V_{EE}$ supply. They are small resistors that reduce sensitivity to noise. A resistor R8 is connected between the $V_{EE}$ supply and the emitter of transistor Q8. Its collector and base are coupled through respective resistors R9 and R10 to the $V_{CC}$ supply. Elements Q8, R9, and R10 establish a substantially constant current through transistor Q7. Neglecting the small base currents in current source 16, the Q7 current is mirrored (or duplicated) in transistor Q6 since transistors Q6 and Q7 have equal emitter areas. Transistors Q6 and Q7 could have different emitter areas so that the Q6 current bears a fixed ratio to the Q7 current. In any case, the Q6 collector current is substantially fixed although the Q6 collector voltage varies as necessary.

Additionally, the input circuit in FIG. 3 has a Schottky diode D3 that prevents input $V_I$ from dropping more than 1 $V_{SH}$ below $V_{EE}$. A Schottky diode D4 prevents current from being transmitted through transistor QB to the $V_{CC}$ supply.

Transistors Q2 and Q5 are part of an output circuit in the gate. Besides them, the output circuit contains transistors Q3 and Q4 and resistors R2, R3, and R5 interconnected with each other and with transistors Q2 and Q5 in the same way as described above for the output circuit of FIG. 1. The interconnected collectors of transistors Q3 and Q4 in FIG. 3 are tied directly to the $V_{CC}$ supply. A Schottky diode D5 in series with resistor R5 reduces the Q5 turn-off time. Schottky diodes D6 and D7 help turn off Darlington pair Q3 and Q4 and also help discharge the load capacitance at the $V_O$ output terminal. Schottky diodes D8, D9, and D10 in combination with an NPN transistor Q9 help discharge the base of transistor Q5 when it turns off.

Output $V_O$ goes to "1" when input $V_I$ goes to "0" and vice versa since the gate in FIG. 3 is an inverter. The input switching point is $2 V_{BE}$ or about 1.5 volts while voltage $V_{TR}$ is $2 V_{BE}-V_{SH}-V_{SAT}$ or about 1.0 volt. The input circuit operates in the manner described above for FIG. 2. Except as pointed out in the preceding paragraph, the output circuit in FIG. 3 operates in the manner described for FIG. 1. Accordingly, no further explanation of the operation is necessary for the gate of FIG. 3. By speeding up the turn-off of transistor Q2 (QA) the input circuit also speeds up the turn-off of transistor Q5.

In FIG. 3, supplies $V_{CC}$ and $V_{EE}$ are preferably 5.0 and 0 volts, respectively. Resistors RA, R2, R3, R5, R6, R7, R8, R9 and R10 respectively are 11,600, 1,500, 4,000, 750, 50, 50, 10,000, 5,000, and 10,000 ohms. The nominal "0" and "1" values for input $V_I$ are 0 and 3.0 volts, respectively. The maximum input current (when voltage $V_I$ is high) is around 5 microamperes. The nominal "0" and "1" values for output $V_O$ respectively are less than 0.55 volt and more than 2.0 volts.

Figure 4:
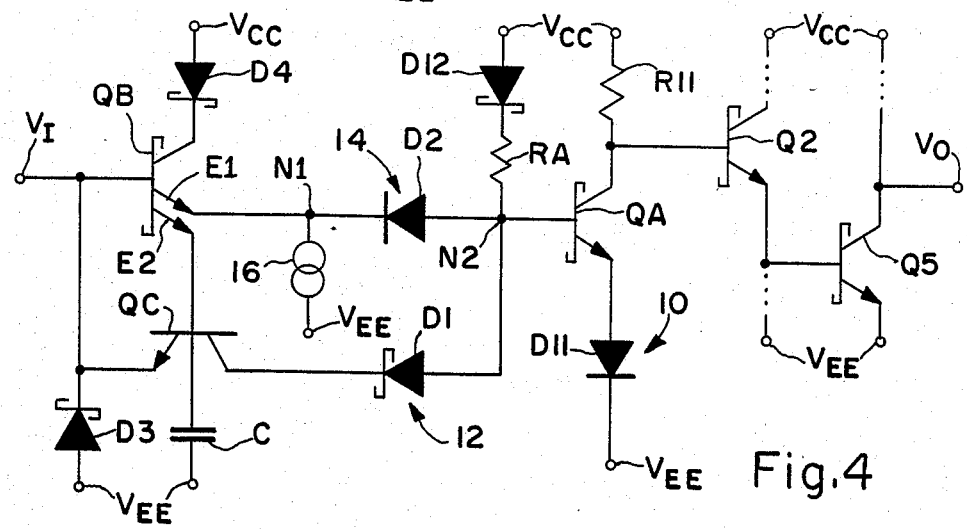

FIG. 4 partially illustrates a preferred embodiment of a TTL non-inverting buffer gate using the input circuit of FIG. 2. In FIG. 4, shifter 10 is a PN diode D11. Voltage $V_{LS}$ is again 1 $V_{BE}$. A resistor R11 which is preferably 5,000 ohms is connected between the QC collector and the $V_{CC}$ supply. Connected to the QC collector is an output circuit containing transistors Q2 and Q5 configured as described above. Preferably, this output circuit contains the same elements configured in the same way as the output circuit in FIG. 3.

The input circuit in FIG. 4 is configured the same as in FIG. 3 except that a Schottky diode D12 is in series with resistor RA. Current source 16 in FIG. 4 is preferably the same as in FIG. 3. Diode D12 is a level shifter which allows ratioing of resistor R10 in current source 16 to resistor RA which is preferably 10,000 ohms here.

Output $V_O$ in FIG. 4 is of the same logical value as input $V_I$ since there is no signal inversion. The input circuit operates in the manner described for FIG. 2. Transistor QA is an inverter. The output circuit in FIG. 4 operates the same as in FIG. 3. Consequently, the operation of the gate in FIG. 4 is clear from the prior discussion. As a result of increasing the QA switching speed, the input circuit also increases the switching speed of transistors Q2 and Q5.

Methods for manufacturing the various elements of the present gates are well known in the semiconductor art. These gates are preferably manufactured in monolithic integrated circuit form according to conventional planar processing techniques using oxide isolation to separate active regions on a semiconductor wafer. While capacitor C may be fabricated in true capacitor form, it may also be manufactured as a PN diode which is reversed biased during normal operation—i.e., the diode has its cathode connected to the QC base and its anode connected to the $V_{EE}$ terminal. One or more of the PN diodes may be an NPN transistor having its base connected to its collector.

While the invention has been described with reference to particular embodiments, this description is solely for the purpose of illustration and is not to be construed as limiting the scope of the invention claimed below. For example, semiconductor elements of opposite polarity to those described above may generally be employed to accomplish the same results. A pair of transistors having interconnected bases that receive the input signal could be used in place of the multiple-emitter input transistor in the present input circuit. Thus, various modifications, changes, and applications may be made by those skilled in the art without departing from the true scope and spirit of the invention as defined by the appended claims.

I claim:

1. A circuit responsive to an input signal at an input terminal for regulating the current/voltage level at a control electrode of a transistor circuit means, the circuit including:
   a bipolar input transistor means having at least one base coupled to the input terminal, a first emitter, and a second emitter, the control electrode being responsive to the voltage at the first emitter;
   a like-polarity bipolar discharge transistor having a base coupled to the second emitter, an emitter coupled to the input terminal; and a collector coupled to the control electrode; and
   a capacitive element coupled between the base of the discharge transistor and a terminal for receiving a supply voltage.

2. A circuit as in claim 1 wherein the discharge transistor temporarily becomes conductive to provide a current path from the control electrode through the discharge transistor when the input signal passes a prescribed transition voltage and also changes more than a specified amount in going from a voltage at which the input transistor means is conductive through the first emitter to another voltage at which the input transistor means is substantially non-conductive through the first emitter.

3. A circuit as in claim 2 wherein the transistor circuit means includes a like-polarity bipolar switching transistor having a base which is the control electrode.

4. A circuit as in claim 3 wherein the current path extends from the base of the switching transistor to the input terminal.

5. A circuit as in claim 3 further including a rectifier coupled between the base of the switching transistor and the collector of the discharge transistor in its forward conductive direction.

6. A circuit responsive to an input signal at a input terminal for regulating the current/voltage level at a control electrode of a transistor circuit means, the circuit including:
   a bipolar input transistor means having at least one base coupled to the input terminal, a first emitter coupled to a first node, and a second emitter;
   a rectifier coupled between the first node and a second node which is coupled to the control electrode, the rectifier oriented back-to-back with the base-emitter junction formed with the first emitter;
   a current source coupled between the first node and a first voltage supply;
   an impedance element coupled between the second node and a second voltage supply;
   a like-polarity bipolar discharge transistor having a base coupled to the second emitter, an emitter coupled to the input terminal, and a collector coupled to the second node; and
   a capacitive element coupled between the first voltage supply and the base of the discharge transistor.

7. A circuit as in claim 6 wherein the transistor circuit means includes a like-polarity bipolar switching transistor having a base which is the control electrode.

8. A circuit as in claim 7 further including a voltage level shifter coupled between the first voltage supply and an emitter of the switching transistor.

9. A circuit as in claim 8 wherein:
   the rectifier comprises a PN diode; and
   the level shifter comprises a PN junction oriented in the forward conductive direction of the base-emitter junction of the switching transistor.

10. A circuit as in claim 9 wherein the PN junction of the level shifter is a base-emitter junction of a like-polarity bipolar transistor.

11. A circuit as in claim 8 wherein the impedance element comprises a resistor.

12. A circuit as in claim 8 wherein the capacitive element comprises a reversed-biased diode.

* * * * *